United States Patent
Fischer et al.

(10) Patent No.: US 6,459,631 B2
(45) Date of Patent: Oct. 1, 2002

(54) CONFIGURATION FOR IMPLEMENTING REDUNDANCY FOR A MEMORY CHIP

(75) Inventors: Helmut Fischer, Taufkirchen (DE); Helmut Kandolf, München (DE); Stefan Lammers, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/907,783

(22) Filed: Jul. 18, 2001

(30) Foreign Application Priority Data

Jul. 18, 2000 (DE) ............................ 100 34 928

(51) Int. Cl.$^7$ .............................................. G11C 7/00
(52) U.S. Cl. ..................... 365/200; 365/225.7
(58) Field of Search ................ 365/200, 225.7, 365/230.03, 230.06

(56) References Cited

U.S. PATENT DOCUMENTS

| | | | | |
|---|---|---|---|---|
| 5,243,570 A | * | 9/1993 | Saruwatari | 365/225.7 |
| 5,642,316 A | * | 6/1997 | Tran et al. | 365/200 |
| 5,956,276 A | | 9/1999 | Sredanovic | 365/200 |
| 5,959,907 A | * | 9/1999 | Kim et al. | 365/200 |
| 5,970,001 A | * | 10/1999 | Noda et al. | 365/200 |

* cited by examiner

*Primary Examiner*—Trong Phan
(74) *Attorney, Agent, or Firm*—Laurence A. Greenberg; Werner H. Stemer; Ralph E. Locher

(57) ABSTRACT

The invention relates to a configuration for implementing redundancy for a memory chip, in which a fuse bank is connected to a comparator via a redundancy predecoder so that predecoded addresses can be compared with one another in the comparator and undecoded addresses can be stored in the fuse bank. This provides for a low-power and space-saving design.

5 Claims, 1 Drawing Sheet

CONFIGURATION FOR IMPLEMENTING REDUNDANCY FOR A MEMORY CHIP

BACKGROUND OF THE INVENTION

Field of the Invention

The present invention relates to a configuration for implementing redundancy for a memory chip that has at least one fuse bank for storing the addresses of defective lines, a comparator for comparing addresses, a predecoder and a decoder for a line and a redundancy decoder for a redundant line. The comparator has a first input supplied with an address predecoded by the predecoder, and the output of the comparator is connected to a disable input of the decoder and to the input of the redundancy decoder.

It is known that defective or faulty lines in memory chips can be replaced by fault-free redundant lines to increase the yield in the production of semiconductor chips. Each semiconductor chip is tested and if it is determined that the chip has one or more faulty lines, then these faulty lines are replaced by redundant lines. Memory chips having faulty lines can still be used as they were fault-free by these means.

Replacing a faulty line by a fault-free redundant line is done in such a manner that the address of the defective line is stored in a fuse bank. If then the memory chip is accessed, each address applied is compared bit by bit with the address information stored in the fuse banks. In other words, it is determined whether an address applied matches an address stored in the fuse banks.

If no match is found, the memory chip is "normally" accessed by a predecoder and a decoder.

If, in contrast, a match is found between the two addresses, the predecoder and the decoder, respectively, which are responsible for a "normal" memory access, are disabled and a redundancy decoder for the fault-free redundant line replacing the faulty line is activated.

There are then various possibilities for designing a configuration for implementing redundancy. The essential factor for such implementations of redundancy is whether undecoded addresses or predecoded addresses are stored for the faulty lines in the fuse banks. This is because the configuration of the fuse banks, the space requirement of the configuration for implementing redundancy and the power consumption during an access of the memory chip depend on whether undecoded or predecoded addresses are stored in the fuse banks.

This will be explained in greater detail in the text which follows, referring to FIGS. 2 and 3 which show various possibilities of how a configuration for implementing redundancy in memory chips can be constructed.

In the configuration shown in FIG. 2, undecoded addresses of faulty lines which are to be replaced by redundant lines are stored in a fuse bank FB. If, for example, a line CSL of a number of such lines is faulty, this line is replaced by its corresponding redundant line SCSL. If the memory chip is accessed, the undecoded address AC supplied with this memory access is compared in a comparator Comp with the undecoded addresses stored in the fuse bank FS. This means that it is determined whether there is a match ("hit?") of the addresses or not. If both addresses match, a predecoder CPD and, if necessary, a decoder CD is disabled ("dis") in the "normal" faulty line CSL and a redundancy decoder SCD is selected in the redundant line SCSL. The decoder CD and the redundancy decoder SCD are preferably accommodated in a block B. Naturally, the memory chip contains a number of fuse banks FB depending on the number of redundant lines SCSL which are allocated to a block B.

To save access time, then, the comparison in the comparator Comp can be made during the predecoding in the predecoder CPD in the configuration of FIG. 2. If the addresses match, only the decoder CD is then disabled ("dis"). However, the significant factor is that the decoder CD is disabled in any case before the predecoded addresses ACijP supplied by the predecoder CPD are present at it.

A great advantage of the concept forming the basis of the configuration of FIG. 2 is the low space requirement. In the fuse banks, the undecoded addresses of the faulty lines are stored so that only a small number of fuses and associated latches are needed for each fuse bank. The disadvantageous factor is, however, the relatively high power consumption which necessarily occurs for each access to a redundant line in the configuration of FIG. 2. The fuse bank FB and the comparator Comp are located relatively far from the redundancy decoder SCD so that, due to the long line distance, a large capacity must be charged up with each access to a redundant line SCSL.

This advantage of high power consumption per access can be avoided by means of a configuration which is designed in the manner shown in FIG. 3. In this case, the fuse banks FB are accommodated close to the redundancy decoder SCD in block B together with the comparator Comp and the decoder CD so that no other long lines need to be driven during an access to the redundant line SCSL. As a result, power can be easily saved. The disadvantageous factor in the concept of the implementation of redundancy forming the basis of FIG. 3 is, however, that predecoded addresses $AcijP_1$ of the faulty lines CSL need to be stored in the fuse banks. This storage of predecoded addresses needs more chip area than the storage of undecoded addresses. This means that in the configuration of FIG. 3, the fuse bank FB must be made much larger than in the configuration of FIG. 2, which also applies to the associated comparator Comp.

SUMMARY OF THE INVENTION

It is accordingly an object of the invention to provide a configuration for implementing redundancy in a semiconductor chip which overcomes the above-mentioned disadvantageous of the prior art apparatus and methods of this general type. In particular, it is an object of the invention to provide such a configuration that requires low power and can be implemented in a space-saving manner.

With the foregoing and other objects in view there is provided, in accordance with the invention a configuration for implementing redundancy for a memory chip. The configuration includes at least one fuse bank for storing undecoded addresses of defective lines. The fuse bank has an output for outputting the undecoded addresses. The configuration includes a line; a predecoder for predecoding an address; and a decoder for the line. The decoder has a disable input. The configuration includes a redundant line and a redundancy decoder for the redundant line. The redundancy decoder has an input. The configuration includes a comparator having a first input receiving the address that is predecoded by the predecoder. The comparator has a second input. The comparator has an output connected to the disable input of the decoder and to the input of the redundancy decoder. The configuration includes a redundancy predecoder connected to the output of fuse bank for receiving the undecoded addresses that are output by the fuse bank. The redundancy predecoder predecodes the undecoded addresses received from the fuse bank and supplies the predecoded addresses to the second input of the comparator. The comparator compares one of the predecoded addresses supplied from the redundancy decoder with the address that is received from the predecoder.

In accordance with an added feature of the invention, latches are provided for storing the undecoded addresses output by the fuse bank.

In accordance with an additional feature of the invention, the redundancy predecoder is a static predecoder.

In accordance with another feature of the invention, there is provided, a block that includes the fuse bank, the redundancy predecoder, the comparator, the redundancy decoder, and the decoder.

The objects of the invention are achieved because the output of the fuse bank is connected to a redundancy predecoder so that the undecoded addresses can be stored in the fuse bank and the comparator can be supplied with the predecoded addresses of the fuse bank at its second input.

In the inventive configuration, the fuse bank can thus be provided close to the redundancy decoder so that in the case of an access to a redundant line, no additional long lines need to be charged up apart from the lines of the predecoder. Instead, the redundancy predecoder predecodes the address stored in the fuse bank in the configuration according to the invention. This makes it possible to store only the undecoded addresses in the fuse bank even though, due to the insertion of the predecoder, the predecoded addresses must then be compared with one another in the comparator. The fuse bank can thus be constructed using only a small chip area.

Overall, the invention thus provides for low-power and space-saving implementation of redundancy for a memory chip.

During a power-up of the memory chip, the addresses stored in the fuse banks are stored in latches. The redundancy predecoder then predecodes the individual addresses stored in the latches as soon as the relevant valid address bits are stored in these latches. For this reason, it is possible to integrate a space-saving static predecoder in the corresponding block for the redundancy predecoder. The output signals of the redundancy predecoder are valid until the memory chip is powered down.

The essential factor in the configuration according to the invention is thus the use of the redundancy predecoder which predecodes undecoded addresses stored in a fuse bank. This minimizes the area needed for the fuse bank. In addition, the fuse bank can be arranged close to the redundancy decoder which decodes the predecoded addresses and this saves power since no long lines need to be provided from the comparator to the redundancy decoder.

Other features which are considered as characteristic for the invention are set forth in the appended claims.

Although the invention is illustrated and described herein as embodied in a configuration for implementing redundancy for a memory chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
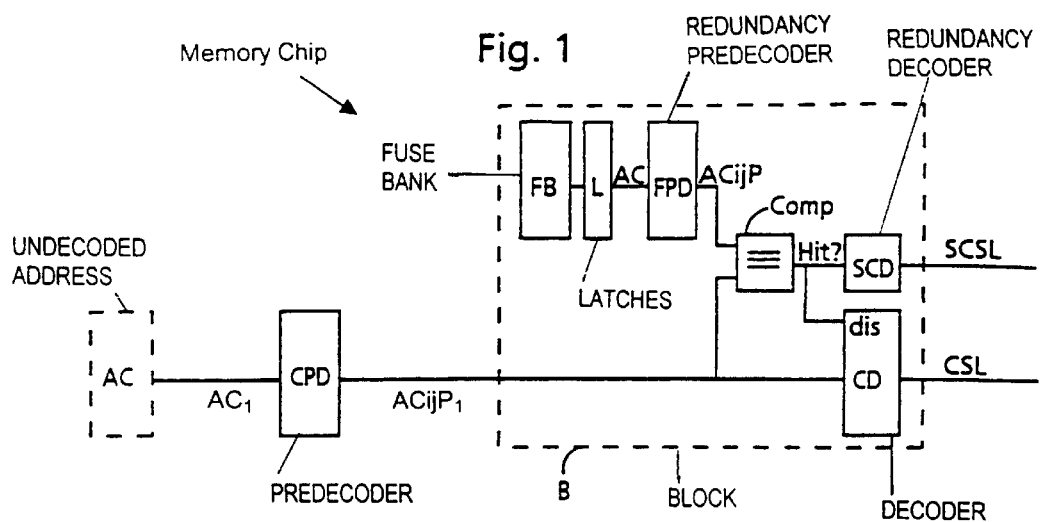
FIG. 1 shows a block diagram of the configuration according to the invention.
Figure 2:
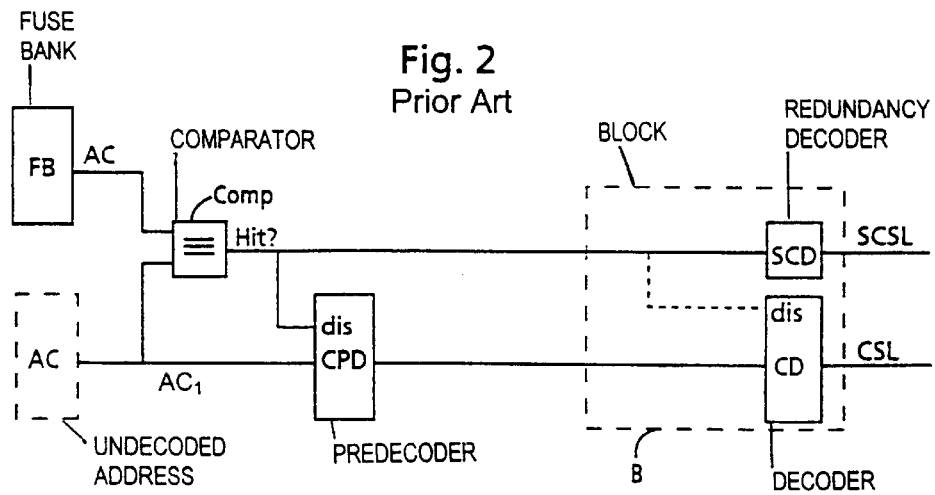
FIG. 2 shows a block diagram of a first prior art configuration for implementing redundancy for a memory chip.
Figure 3:
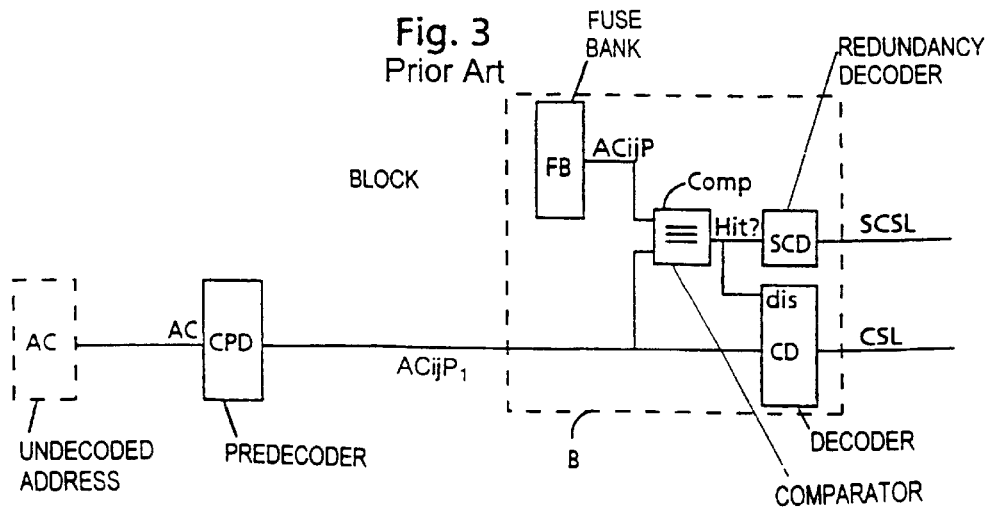
FIG. 3 shows a block diagram of a second prior art configuration for implementing redundancy for a memory chip.

Referring now to the figures of the drawing in detail and first, particularly, to FIG. 1 thereof, there is shown a block diagram of a configuration for implementing redundancy in a semiconductor memory chip. Undecoded addresses $AC_1$ of a memory chip are transformed into predecoded addresses $AcijP_1$ by a predecoder CPD. These predecoded addresses $AcijP_1$ are supplied to a block B in which fuse banks FB are provided in which undecoded addresses of faulty lines, that is to say, for example, of the line CSL, are stored. These undecoded addresses AC are converted into predecoded addresses ACijP in a redundancy predecoder FPD. The predecoded address for the line CSL, which is supplied to block B, is then compared with the predecoded addresses of the fuse bank FB in the comparator Comp. If there is a match, a decoder CD of the then faulty line CSL is disabled ("dis") and the redundancy decoder SCD then decodes the address for the corresponding redundant line SCSL so that it can be accessed.

In this manner, only undecoded addresses need to be stored in the fuse bank FB in the configuration according to the invention even though the predecoded addresses are compared with one another in the comparator Comp by including the redundancy predecoder FPD. The fuse bank FB is arranged close to the redundancy decoder SCD in block B so that in the event of a redundancy access to the redundant line SCSL, no additional long lines need to be charged up apart from the long line of the predecoder CD.

Overall, a space-saving and low-power implementation of redundancy is thus possible.

As has already been explained initially, the addresses stored in the fuse bank FB are temporarily stored in latches L during power-up of the memory chip. The redundancy predecoder FPD then decodes the individual addresses as soon as their valid address bits are stored in the latches L. This makes it possible to integrate a space-saving static predecoder for the redundancy predecoder FPD in block B.

We claim:

1. A configuration for implementing redundancy for a memory chip, comprising:

at least one fuse bank for storing undecoded addresses of defective lines, said fuse bank having an output for outputting the undecoded addresses;

a line;

a predecoder for predecoding an address;

a decoder for said line, said decoder having a disable input;

a redundant line;

a redundancy decoder for said redundant line, said redundancy decoder having an input;

a comparator having a first input receiving the address that is predecoded by said predecoder, said comparator having a second input, said comparator having an output connected to said disable input of said decoder and to said input of said redundancy decoder; and a redundancy predecoder connected to said output of fuse bank for receiving the undecoded addresses that are output by said fuse bank;

said redundancy predecoder predecoding the undecoded addresses received from said fuse bank and supplying the predecoded addresses to said second input of said comparator; and said comparator comparing one of the predecoded addresses supplied from said redundancy decoder with the address that is received from said predecoder.

2. The configuration according to claim 1, comprising latches for storing the undecoded addresses output by said fuse bank.

3. The configuration according to claim 2, wherein said redundancy predecoder is a static predecoder.

4. The configuration according to claim 1, wherein said redundancy predecoder is a static predecoder.

5. The configuration according to claim 1, comprising a block that includes said fuse bank, said redundancy predecoder, said comparator, said redundancy decoder, and said decoder.

* * * * *